US005774369A

United States Patent [19]
Horstmann et al.

[11] Patent Number: 5,774,369
[45] Date of Patent: *Jun. 30, 1998

[54] COMPUTER PROGRAM PRODUCT FOR ENABLING A COMPUTER TO REMOVE REDUNDANCIES USING QUASI ALGEBRAIC METHODS

[75] Inventors: Paul William Horstmann, Pleasant Valley; Thomas Edward Rosser, Poughkeepsie, both of N.Y.; Prashant Srinivasrao Sawkar, Glenshaw, Pa.

[73] Assignee: International Business Machines Corporation, Armonk, N.Y.

[ * ] Notice: The term of this patent shall not extend beyond the expiration date of Pat. No. 5,524,082.

[21] Appl. No.: 466,917

[22] Filed: Jun. 6, 1995

Related U.S. Application Data

[62] Division of Ser. No. 723,121, Jun. 28, 1991, Pat. No. 5,524,082.
[51] Int. Cl.⁶ ................................................ G06F 17/50
[52] U.S. Cl. .......................................... 364/489; 364/488
[58] Field of Search .................................. 364/488, 489, 364/490

[56] References Cited

U.S. PATENT DOCUMENTS

| | | | |
|---|---|---|---|
| 4,503,537 | 3/1985 | McAnney | 371/25 |
| 4,591,993 | 5/1986 | Griffin et al. | 364/491 |
| 4,703,435 | 10/1987 | Darringer et al. | 364/489 |
| 4,726,023 | 2/1988 | Carter et al. | 371/15 |
| 4,816,999 | 3/1989 | Berman et al. | 364/489 |
| 4,862,399 | 8/1989 | Freeman | 364/580 |
| 4,916,627 | 4/1990 | Hathaway | 364/490 |
| 5,029,102 | 7/1991 | Drumm et al. | 364/489 |
| 5,140,526 | 8/1992 | McDermith et al. | 364/488 |

OTHER PUBLICATIONS

"A Rule–Based System for Optimizing Combinational Logic", de Geus et al., IEEE Design and Test, pp. 22–32, 1985.

J.C. Sutton, III and J.G. Bredeson, "Minimal Redundant Logis for High Reliability and Irredundant Testability", IEEE Transactions On Computers, vol. c–29, No. 7, pp. 648–656, Jul., 1980.

J.A. Darringer, W.H. Joyner, Jr., C.L. Berman and L. Trevillyan, "Logic Synthesis Through Local Transformations", IBM J. Res. Develop., vol. 25, No. 4, pp. 272–280, Jul., 1981.

R.K. Brayton, "Factoring logic functions", IBM J. Res. Development, vol. 31, No. 2, pp. 187–190, Mar., 1987.

K.A. Bartlett, et al., "Multilevel Logic Minimization Using Implicit Don't Cares", IEEE Transactions on Computers, vol. c–32, No. 10, pp. 947–952, Oct., 1983.

L. Trevillyan, W. Joyner and L. Berman, "Global Flow Analysis in Automatic Logic Design", IEEE Transactions on Computers, vol. c–35, No. 1, pp. 77–81, Jan., 1986.

R. Dandapani and S.M. Reddy, "On the Design of Logic Networks with Redundancy and Testability Considerations", IEEE Transactions on Computers, vol. c–23, No. 11, pp. 1139–1149, Nov., 1974.

J.P. Roth, "Minimization by the D Algorithm", IEEE Transactions On Computers, vol. c–35, No. 5, pp. 476–478, May, 1986.

(List continued on next page.)

*Primary Examiner*—Vincent N. Trans
*Attorney, Agent, or Firm*—Sterne, Kessler, Goldstein & Fox P.L.L.C.; Lawrence D. Cutter, Esq.

[57] ABSTRACT

A method is provided to remove redundancies in multi-level logic networks caused by reconverging signals at Boolean sum and product nodes. Generally, sum and product nodes which have potential redundancies are first identified. For each reconvergent signal at each of the nodes, it is determined whether it introduces redundancies using nondestructive Boolean analysis. No two-level expansion is made of the logic network. Moreover, for each confirmed redundancy, a redundant term is identified using Boolean analysis. Finally, the redundancy is removed, if desirable.

16 Claims, 10 Drawing Sheets

OTHER PUBLICATIONS

T.F. Schwab and S.S. Yau, "An Algebraic Model of Fault–Masking Logic Circuits", IEEE Transactions on Computers, vol. c–32, No. 9, pp. 809–825, Sep., 1983.

D. Brand, "Redundancy and Don't Cares in Logic Synthesis", IEEE Transactions on Computers, vol. c–32, No. 10, pp. 947–952, Oct., 1983.

R.K. Brayton et al., "MIS: A Multiple–Level Logic Optimization System", IEEE Transactions on Computer–Aided Design, vol. CAD–6, No. 6, pp. 1062–1080, Nov., 1987.

C.C. Chao, "AC Test Pattern Generation For Sequential Logic", IBM Technical Disclosure Bulletin, vol. 16, No. 8, pp. 2439–2441, Jan., 1974.

D. Brand, "Detecting Redundancy And Don't Cares In Logic Circuit Design", IBM Technical Disclosure Bulletin, vol. 26, No. 7A, pp. 3456–3463, Dec., 1983.

R.K. Brayton, C.L. Chen and J. Yamour, "Method For Optimizing Logic For Single–Ended Domino Logic Circuits", IBM Technical Disclosure Bulletin, vol. 27, No. 78, pp. 4398–4401, Dec., 1984.

D.E. Popp, "Method For Removing Redundancies From Programmable Logic Arrays", IBM Technical Disclosure Bulletin, vol. 28, No. 10, pp. 4677–4682, Mar., 1986.

W.B. Perlowitz, "Detection of Multiplexer Structures In Logic", IBM Technical Disclosure Bulletin, vol. 30, No. 7, pp. 36–38, Dec., 1987.

J.L. Gilkinson and R.C. Itskin, "Iterative Consensus And Absorption", vol. 30, No. 9, pp. 379–380, Feb., 1988.

D.O. Forlenza, et al., "Test Generation of AC Faults Using Weighted Random Patterns", IBM Technical Disclosure Bulletin, vol. 32, No. 3A, pp. 4–6, Aug., 1989.

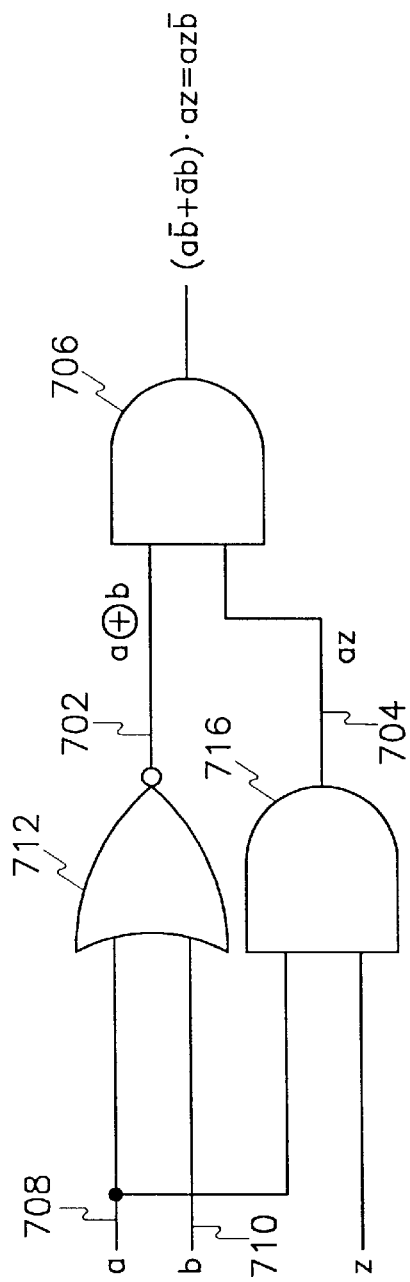
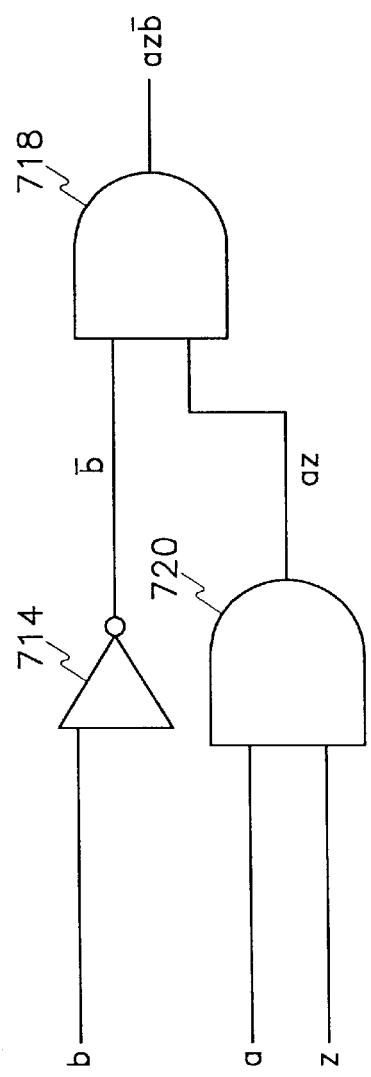
Fig. 7(a)
Fig. 7(b)

COMPUTER PROGRAM PRODUCT FOR ENABLING A COMPUTER TO REMOVE REDUNDANCIES USING QUASI ALGEBRAIC METHODS

This application is a division of application Ser. No. 07/723,121, filed Jun. 28, 1991, now U.S. Pat. No. 5,524,082, issued Jun. 4, 1996.

TECHNICAL FIELD

The present invention relates generally to logic networks and, more particularly, to an efficient method for simplifying the hardware implementation of combinational logic by removing redundancies.

BACKGROUND ART

Logic networks comprise elemental logic blocks for performing Boolean logic functions on data. Logic blocks are commonly identified by the Boolean logic function which they individually perform. Logic blocks can take the form of simple logic gates for example, "AND", "OR", "NAND", and "NOR" logic gates, to name a few, which are well known in the art. Logic blocks can also be "combinational" logic, where simple logic gates are cascaded in electrical series and/or parallel to collectively perform a Boolean logic function upon logic inputs to provide a logic output. In combinational logic, the overall logic function is determined by the individual logic functions performed by the individual logic gates.

At present, when logic circuits are being designed, a logic designer initially focuses upon the requisite global functionality of the logic network. The designer knows what the inputs and outputs to the overall logic network will be. Further, the designer knows what the output logic states should be, based upon all of the various combinations of input logic states. From the foregoing design parameters, the designer derives a workable logic network to provide the desired functionality with the fundamental logic blocks. The resultant logic network may have numerous successive levels of logic.

During the next stage in the design of logic circuits, the logic network is optimized (also, "minimized") usually with the aid of a computer program (Computer Automated Design; CAD) utilizing one or more of many known minimization algorithms. Logic optimization is desirable because it enhances circuit reliability, increases the overall speed of the logic network and reduces the number of circuits.

One form of logic optimization that has been difficult and time-consuming in the art is the identification and removal of redundant logic. Redundant logic may take the form of "untestable" logic or actual "logically redundant logic." Untestable logic refers to logic which does not affect the functional outcome of logic network. In other words, even if the logic failed, it would not affect the overall function of the logic network, and in fact, cannot be noticed under any condition. Logically redundant logic means that a necessary logic function is performed more than once, but is testable.

Thus, logic blocks which are identified as performing redundant logic functions are eliminated to optimize the logic network. Three major forms of redundancy removal are known in the industry: local, global, and two-level optimization using Boolean algebraic techniques. Local optimization is similar to so-called "peephole" optimizations in a compiler. In local optimization, specific patterns are looked for in small areas of the logic, until every small area of the logic has been examined. In comparison, global optimization employs focusing upon large areas of logic. Two-level optimization is described below.

Many Boolean algebraic techniques are available for optimization of large multi-level logic networks. Examples are described in R. K. Brayton, "Factoring Logic Functions," IBM Journal of Research & Development, Vol. 31, No. 2, March 1987; R. K. Brayton, R. Rudell, A. S. Vincentelli, and A. R. Wang, "MIS: A Multiple-Level Logic Optimization System," IEEE Trans. on CAD, Vol. 7, No. 6, June 1988.

Generally, when performing a Boolean analysis, the multi-level logic network is reconfigured into two successive levels of logic blocks between the primary logic inputs and outputs. Most logic networks, or at least parts thereof, can be modelled by two levels of logic via the previously mentioned conventional techniques.

During the Boolean algebraic minimization process, the Boolean equation of each logic output is manipulated until a two-level configuration of logic blocks is realized for each output, where each output is defined by either a "sum of products" or a "product of sums." A "sum of products" is essentially a logic configuration where the first level comprises exclusively AND logic blocks, while the second level consists of an OR logic block. In contrast, a "product of sums" is essentially a logic configuration where the first level only comprises OR logic blocks, while the second level consists of an AND logic block.

Pursuant to conventional Boolean analysis, the two-level configuration is analyzed for common logic terms. Redundant logic terms are eliminated at each level. Often, logic blocks can be eliminated as well. Generally, when the logic network is configured in two levels, huge logic blocks (e.g., OR or AND logic blocks) with many inputs are derived.

During the layout phase of the manufacture of an integrated circuit (IC), the logic blocks may need to be expanded into smaller logic blocks because of time and space requirements. Expansion is required in order to provide for the physical placement of logic blocks and their interconnections on the IC. When expansion is performed, redundancies are typically reintroduced. Optimization using Boolean algebra and algebraic factoring is performed as expansion commences so as to generate streamlined logic locally to where the logic is needed or positioned on an IC chip.

It should be noted that some logic networks, or at least parts thereof, cannot be translated into two levels of logic. An example of this type of logic is that which comprises feedback loops. In such networks, Boolean analysis of the network is performed to the extent possible. Hence, a complete and thorough minimization of the network cannot be accomplished.

Finally, the logic network is implemented in hardware on an IC, based upon the streamlined version of the logic network derived from the minimization process. The logic network will have the same functionality as envisioned by the designer, but will have a different composition of logic blocks as a result of the simplification process.

After implementation in an IC, test generation processes are performed on the logic network in order to test the integrity of the IC and also the manufacturing process. The use of a "D-algorithm" (short for Defect algorithm) for test generation is well known in the art. Many versions of D-algorithms exist in the industry. D-algorithms are described in J. P. Roth, "Minimization by the D Algorithm," IEEE Transactions on Computers, Vol. C-35, No. 5, pp. 476–478, May 1986.

The test generation process using the D-algorithm proceeds as follows. Combinations of inputs and input states are generated and passed through the logic network. The results at the outputs are then observed and analyzed. The expected response of the network is known and is compared to the experimental results.

Essentially, during the implementation of the D-algorithm, defects, or faults, in manufacturing are identified. Faults can cause "stuck at" problems ("stuck at faults"), which are well known in the art. Generally, the "stuck at" concept refers to the condition when an improper logic state exists at a node due to improper manufacture. As an example, consider when an AND logic block in a logic network has an input which is always maintained, or "stuck," at a logic low due to a defect, then the output will always be at a logic low because of the controlling, stuck input. Consequently, the IC is defective and should be discarded.

However, the foregoing approach to test generation is burdensome. Execution of the D-algorithm requires an undesirably enormous amount of time, oftentimes hours or days, when the logic networks have many levels of logic blocks. Typical logic networks can have, for example, fifteen to twenty levels of logic. Thus, the number of unique inputs and the number of observable points from the point of a fault are extraordinarily numerous. Consequently, testing the logic paths consumes an undesirable amount of time.

Furthermore, using test generation to identify and remove redundancies is even more undesirable. Each time that the logic at issue is modified, via removal of a redundancy, the test generation process must be commenced again from the start for all faults in the logic.

SUMMARY OF THE INVENTION

The present invention optimizes the ultimate implementation of a logic network by eliminating redundancies in signal paths caused by reconverging signals. It greatly expands upon the scope of classical techniques for logic design optimization. The present invention employs a modified D-algorithm analysis in conjunction with a Boolean algebraic analysis in order to optimize logic networks. The modified D-algorithm is used to test and isolate small logic blocks within the overall logic description. Further, a Boolean algebraic technique is then used to identify redundancies and redundant terms which can ultimately be deleted, if desired, to simplify the logic.

In accordance with the present invention, Boolean sum and product nodes are identified in a data base model of the logic network. Next, for each reconvergent signal at each of the sum and product nodes, it is determined whether a redundancy exists. If a redundancy exists, then the one or more redundant terms are identified. Finally, the redundant term is removed from the model, if desired.

The present invention overcomes the deficiencies of the prior art, as noted above, and further provides for the following additional advantages.

The method of the present invention removes redundancies caused by reconverging signals at both sum nodes (SN), including OR, NOR, OA, and OAI logic blocks, and product nodes (PN), including AND, NAND, AO, and AOI logic blocks. A modified D-algorithm is initially applied to a pair of cones of a logic block in order to establish that a term in one cone is a subset of a term in the other cone. A Boolean algebraic analysis is then used to detect the exact term in a cone which must be deleted in order to remove the redundancy, if desired.

In comparison to presently existing logic optimization methods, the present invention significantly reduces the requisite time for simplification of the logic. Extensive Boolean equations need not be stored as with conventional methods because the algorithm of the present invention limits analysis to small cones (small logic blocks) of interest. Generally, the present method is much faster than purely algebraic or purely D-algorithm based approaches if configured to perform equivalent functions. Worth noting is that the present invention is more useful as the logic network becomes more complex and multi-layered.

In the present invention, points, or nodes, of interest are isolated and focused upon in a logic network. The nodes of interest need not be at the outputs of the logic network, as with conventional techniques. The nodes can be internal to the overall logic description.

The present invention removes almost all logic redundancies (almost 100%, but not quite, because of unknown logic blocks and sequential logic) at nodes in a logic network which can cause untestable conditions in the presence of single input/output stuck faults.

The present invention provides for redundancy removal irrespective of the model which is given. Specifically, removal of redundancies can be performed regardless of the conceptual level of the model or whether the model is dependent upon a particular hardware implementation, such as in master slice technology, where a chip is subdivided into uniform areas for implementing logic functions. In master slice technology, it might not be desirable to have the simplest function.

As a result of the present invention, logic circuits can be manufactured which are more testable in meaningful amounts of time. The method of the present invention provides an excellent mechanism for merging logic functions in several integrated circuits (IC) into a single IC.

Further advantages of the present invention will become apparent to one skilled in the art upon examination of the following drawings and the detailed description. It is intended that any additional advantages be incorporated herein.

The foregoing and other objects, features and advantages of the invention will be apparent from the following more particular description of preferred embodiments of the invention, as illustrated in the accompanying drawings.

BRIEF DESCRIPTION OF DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

FIG. 7A and 7B illustrate methods of removing redundancies in accordance with the present invention wherein logic is replicated with the deletion of the maximum redundant term.

DETAILED DESCRIPTION OF THE INVENTION

Figure 1:
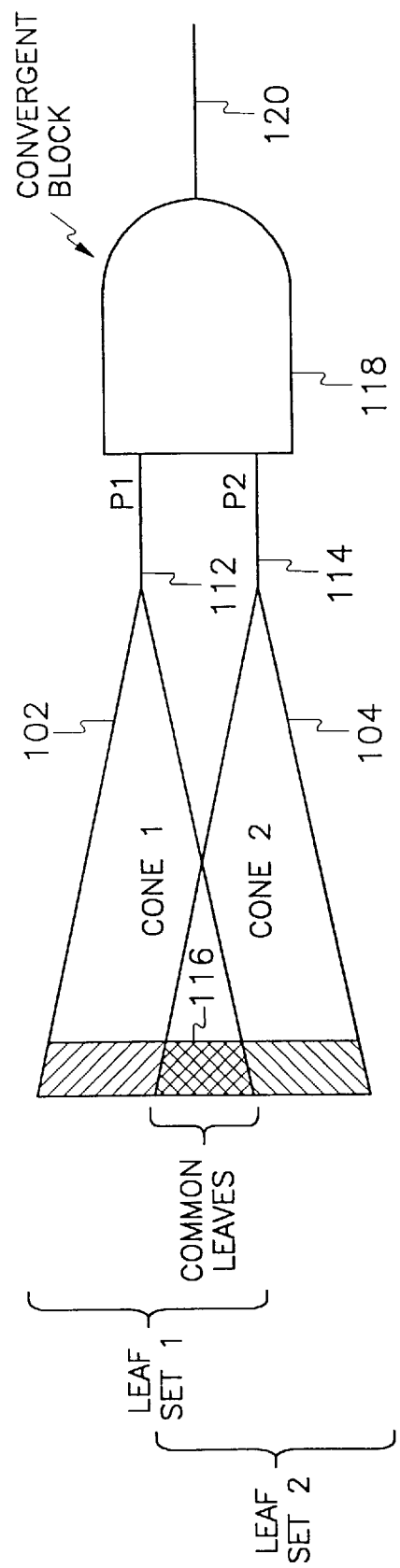
FIG. 1 illustrates fundamental concepts in regard to the present invention.

FIG. 1 illustrates fundamental concepts in regard to the present invention. In accordance with the present invention, computer models of logic networks are analyzed by aggregating logic blocks into "cones" within the overall logic network. As an example, FIG. 1 shows cone 102 (cone 1) and cone 104 (cone 2), which could encompass any number of logic blocks in combination.

The inputs to the cones are called "leaves", which originate at "leaf nodes." Leaves can be primary inputs, latch outputs, register outputs, memory outputs, outputs from unknown logic blocks whose infrastructure is not known or cannot be understood, and outputs from other SNs or PNs, which are discussed in detail below. The foregoing inputs corresponding to a cone are referred to collectively as the leaf set of the particular cone. Hence, as shown in FIG. 1, leaf set 1 corresponds with cone 1, denoted by reference numeral 102, and leaf set 2 corresponds with cone 2, denoted by reference numeral 104.

Each of cones 102 and 104 terminate at a "root pin." Cone 102 terminates at root pin 112 (P1), and cone 104 terminates at root pin 114 (P2). The root pins 112 and 114 are essentially inputs to a subsequent stage of logic, which by example is shown in FIG. 1 as AND logic block 118. The input signals comprising the leaves of each of cone 102 and 104 may feed through several stages of combinational logic prior to reaching the respective root pin.

Root pins 112 and 114 are defined by identifying sum nodes (SN) and product nodes (PN) within the logic network. Essentially, a SN is a node wherein the first logic function performed in the Boolean equation describing the logic function at the SN is an OR or NOR function. In contrast, if the first logic function that is performed is an AND, then it is a product node.

As an example, in FIG. 1, node 120 is a product node because in the Boolean equation defining the logic signal at this node, the AND logic function specified by logic block 118 is performed first.

If a potential redundancy (untestable or logically redundant) is present, then a "convergence" occurs at node 120. "Convergence" means that a logic term resides in several minterms (subterms) of the Boolean equation describing the overall logic signal at node 120. Logic block 118 associated with convergent node 120 is referred to as a "convergent logic block."

If convergence occurs, root pins 112 and 114 define respective cones 102 and 104 with common leaves (inputs), as is shown in FIG. 1 by reference numeral 116. In other words, the leaves "fan out" to more than one cone and converges again at logic block 118.

Pursuant to the present invention, any identified potential redundancies are analyzed further and are removed, if desired, as is discussed in detail below. Some testable redundancies are tolerable, such as with master slice technology. However, untestable redundancies should always be eliminated when found.

Figure 2:
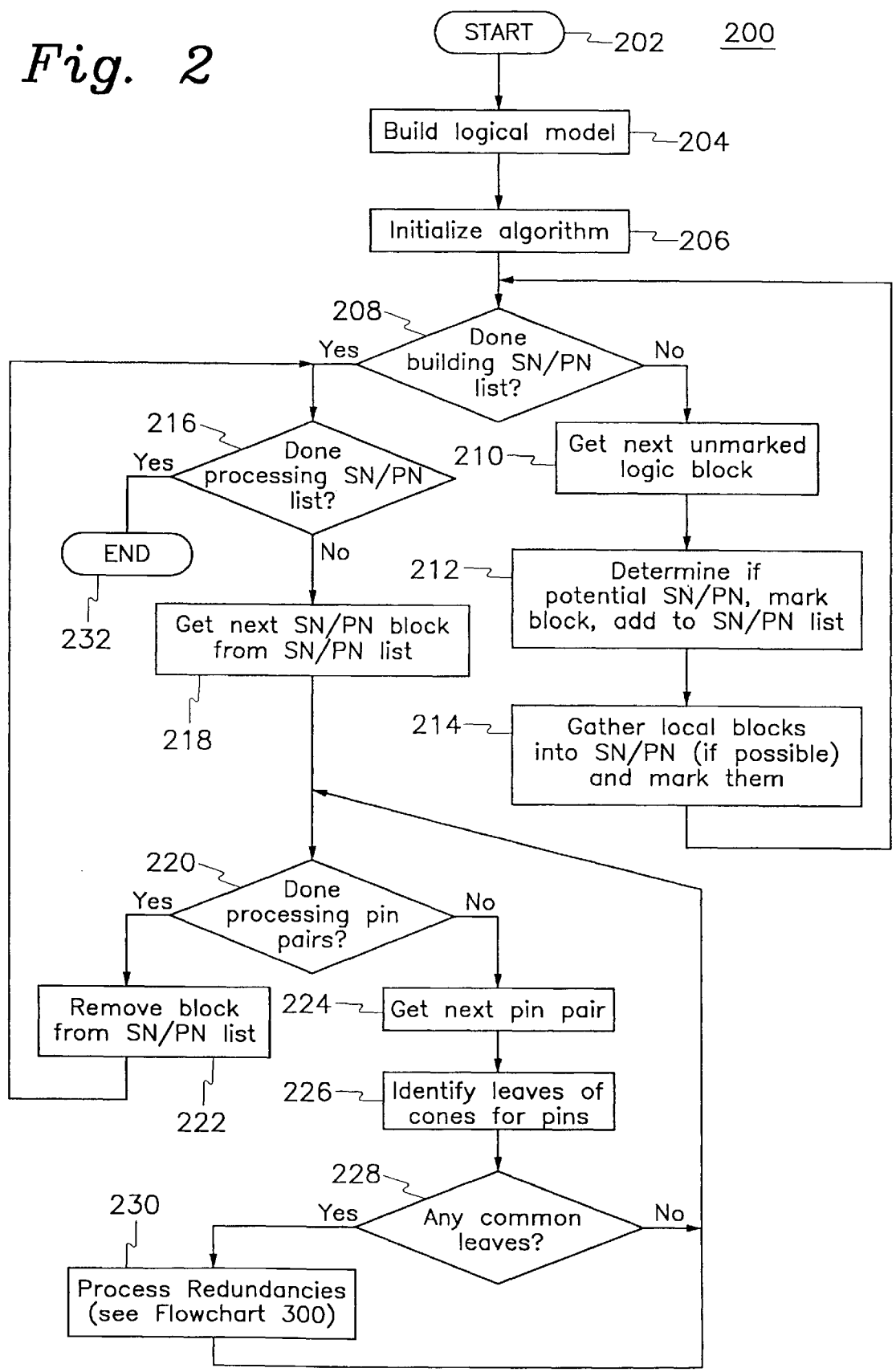
FIG. 2 shows a high level flowchart showing the overall method of the present invention.

FIG. 2 illustrates a high level flowchart showing a method of the present invention. In effect, the present invention applies a modified D-algorithm to a pair of cones of an SN/PN logic block in order to establish that a term in one cone is a subset of a term in the other cone. A Boolean quasi-algebraic analysis is then used to detect the exact term in a cone which is to be deleted in order to remove the redundancy, if desired. This process is repeated for all common leaves of the SN or PN, and the overall process is repeated for all SN and PN.

At flowchart block 202, a logic model description is initially inputted via a list-form language and stored in a data structure. The logic model description includes a list of logic blocks, a list of pins for each logic block, and a list of connections, or "nets", for each pin. A logic block is an area in a logic network where a logic function is performed on a set of inputs to derive outputs. The list of logic blocks could include 100,000 entries or more. Numerous inputs and outputs to the logic block can exist. Typically, a logic block has one or two outputs, comprising an in-phase solution, its inverse, or both.

Because the program having the novel algorithm which processes the data structure is separate from the data structure, the program for analyzing the data structure is initialized (see flowchart block 204). In other words, variables, loop flags, and the like are set to starting values, as is well known in the art.

Next, the model is analyzed in its entirety in order to generate a sum node/product node (SN/PN) list. Essentially, an SN/PN list is generated which is of particular interest to the method of the present invention. The SN/PN list has a listing of all SNs and PNs which could have a potential redundancy. As indicated in flowchart block 208, the foregoing analysis is a onetime event. Moreover, it is shown in successive flowchart blocks 210, 212 and 214.

At flowchart block 210, a logic block is selected from the logic model. Further, it is determined whether the logic block is associated with a potential SN or PN, as indicated in flowchart block 212.

The function of this logic block is considered in order to determine whether the block is a SN (first function exhibits OR characteristics) or PN (first function exhibits AND characteristics). Moreover, the logic block is not placed on the list unless it fans out to more than one place, as shown and described previously with respect to FIG. 1. If the logic block meets these requirements, then the logic feeding its input pins is examined to see if any leaf nodes fan out and reconverge at this logic block (using efficient path tracing on all cones simultaneously). The logic blocks identified as a SN or PN are flagged as convergent logic blocks and their identity is entered on the SN/PN list.

Once, an SN or PN logic block is identified, the output connections of the logic block are considered so as to potentially further simplify the SN/PN list by viewing several logic blocks together as a single global logic block. This procedure is desirable, but optional, and is specified in flowchart block 214. In doing so, larger reconvergences can be considered when sampling pin pairs, as is discussed in detail further herein below.

Because of the manner in which the SN/PN list is generated, the existence of only one place of reconvergence, for a common leaf for a pin-pair, is guaranteed. The foregoing guarantee allows for simpler implementation of the invention.

Hence, after the entire SN/PN list has been completed, a number of interest points (SNs and PNs) has been generated for consideration by the novel algorithm. Moreover, at each interest point, the logic function was understood as either an AND or OR function, but it should be understood that Sum or Product nodes are not limited to these Boolean functions. The set of interest points is distinctly smaller than the number of logic blocks present in the model description at flowchart block 204.

Next, at flowchart blocks 216–232, the SN/PN list is operated upon by the present method in order to optimize the logic network. At flowchart block 216, a determination is made as to whether all of the SN and PN on the SN/PN list have been considered. Upon completion of the analysis of each SN and PN, the algorithm terminates at flowchart stop block 232.

When SNs or PNs still remain on the list for analysis, then the next SN logic block or PN logic block is retrieved for analysis, as indicated in flowchart block 218.

For each logic block, a pair of pins at the logic block's inputs is considered at a time, until all potential pair combinations pertaining to a logic block have been considered. For example, if the convergent logic block had three inputs, then the pairs would be 1,2; 1,3; and 2,3. Viewed another way, two cones converging at the logic block at issue are analyzed at a time until all cone combinations have been considered.

After all pin pairs have been analyzed, then the present method removes the logic block from consideration, as set forth in flowchart block 222, and returns to flowchart block 216 where any remaining logic block entries in the SN/PN list are retrieved. Conversely, if not all pin pairs have been considered, then the next pin pair is retrieved, as indicated in flowchart block 224.

Once a pin pair has been selected, the leaf set for each pin is identified, as set forth in flowchart block 226, and the leaf sets are compared to determine if any leaves are common, as shown in flowchart block 228. If no common leaves exist, then the next pin pair, if any, is retrieved as shown.

If one or more common leaves do exist, then reconvergence exists. Moreover, any reconvergence implies the existence of a potential redundancy. If a redundancy exists, only one actual redundant term (RT) will exist in the Boolean equation for that common leaf, due to the manner in which SNs and PNs are generated. The redundant term is the maximum (largest) logic term that contains the reconvergent signal.

The foregoing analysis of pin pairs can be referred to as nondestructive Boolean algebraic analysis. The analysis is "nondestructive" because it occurs in data tables apart from the model of the logic network. Also worth noting is that no two level expansion of the logic network is needed in the present invention, as is the case with traditional Boolean algebraic approaches.

As indicated in 230, the redundancies are then processed. For each redundancy, a Boolean analysis is performed to determine the redundant term. During processing, it is determined whether or not a redundancy should be removed. In certain circumstances, it might not be desirable to remove a redundancy, so as to permit compact logic. This is an optional feature of the present invention. A detailed description of processing redundancies is presented with respect to FIG. 3.

If a redundancy is to be removed, then generally the pin is disconnected from one of the cones which overlap. Furthermore, if the removal of a redundancy results in logic blocks which lead nowhere, then these logic blocks can be removed to further simplify the logic network. Redundancy removal is discussed in detail in FIG. 6.

Figure 3:
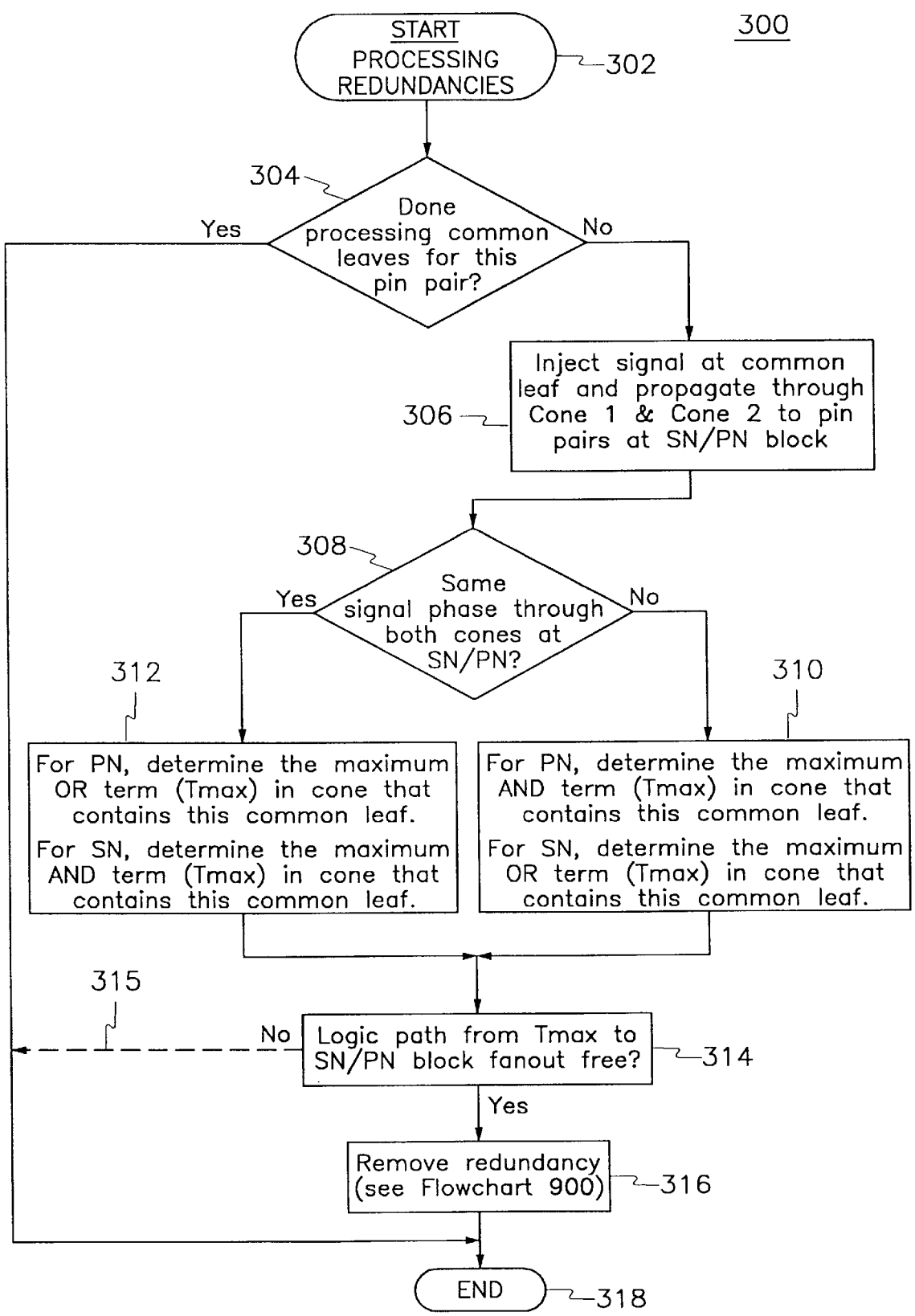
FIG. 3 illustrates the method for processing redundancies wherein a maximum redundant term is identified and a determination is made as to whether the redundant term should be removed.

FIG. 3 shows a detailed flowchart 300 for processing redundancies. Specifically, a redundant term is identified using a Boolean analysis.

At flowchart block 304, a counter is implemented to insure that all common leaves of each pin pair are considered. If all common leaves have been processed, then flowchart 300 proceeds to flowchart end block 318. Otherwise, flowchart 300 proceeds in normal operation to flowchart block 306.

At flowchart block 306, a signal is injected at the common leaf in each cone. The signal is propagated through the respective cone to the respective root pin (one pin of the pin pair) at the convergent SN/PN logic block.

A redundant term of a Boolean equation can be a either "maximum AND term" or a "maximum OR term" containing the reconvergent signal. A maximum AND term is defined to be an AND term that the desired signal participates in, prior to encountering the first OR function (also referred to as the terminating condition).

For example, consider the following arbitrary Boolean logic term: (a.b.c+p.q.r).l.m The maximum AND term containing "a" is "a.b.c", and not "a.b.c.l.m", because "a.b.c" is operated on by the OR function along with "p.q.r" prior to being operated on by the AND function along with "l.m".

In contrast, a maximum OR term is defined to be an OR term that the desired signal participates in, prior to encountering the first AND function (also referred to as a terminating condition).

For example, consider the following arbitrary Boolean logic term: (a+b+c).(q+r)+l.m The maximum OR term containing "a" is "a+b+c", because "a+b+c" is operated upon by an AND function along with "(q+r)", prior to being operated upon by an OR function along with "l.m".

Figure 4A:
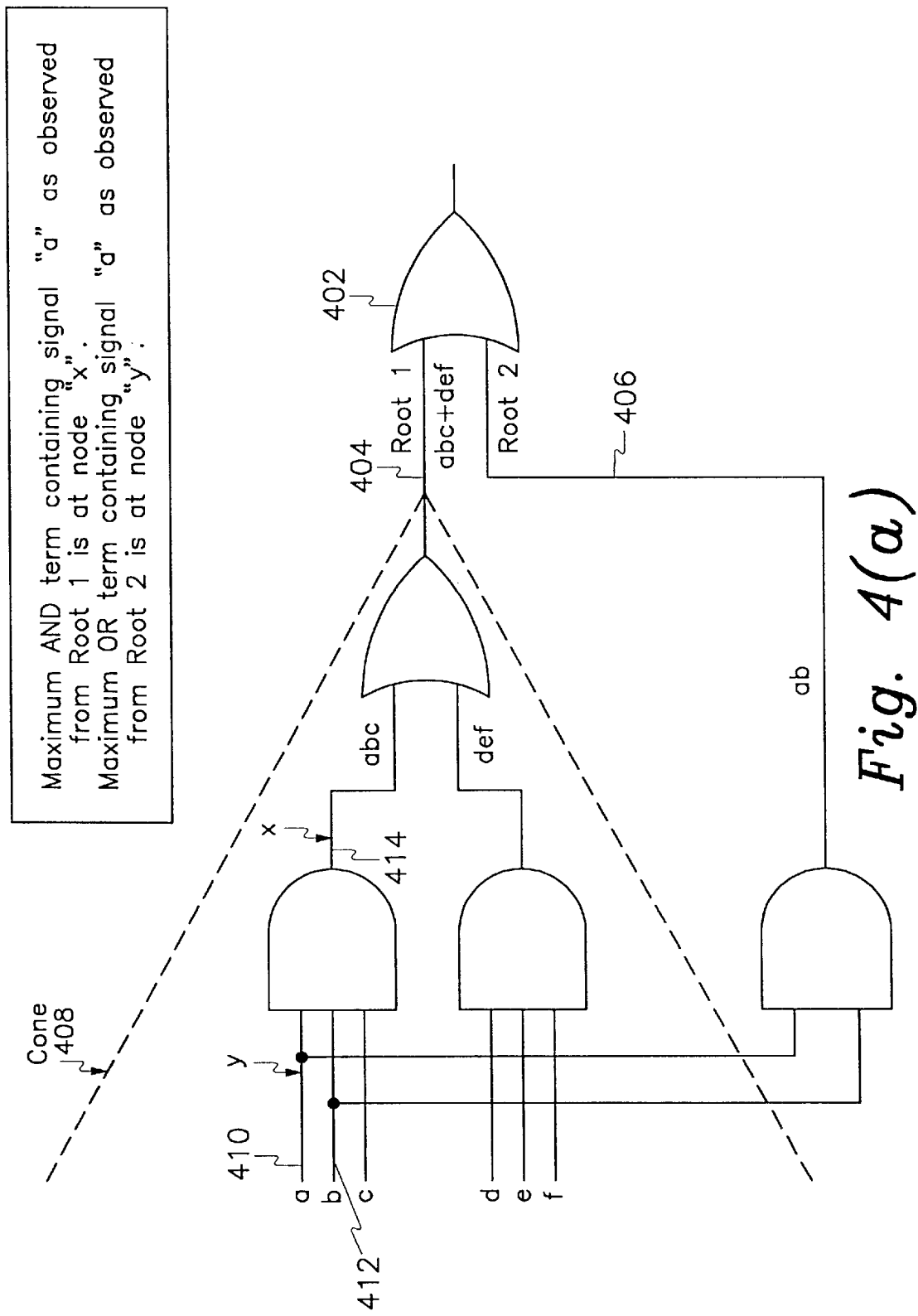
FIGS. 4(a) and 4(b) illustrate the concepts of a maximum AND term and a maximum OR term when a convergent logic block is either a Boolean sum node (SN) or a Boolean product node (PN), respectively.
Figure 4B:
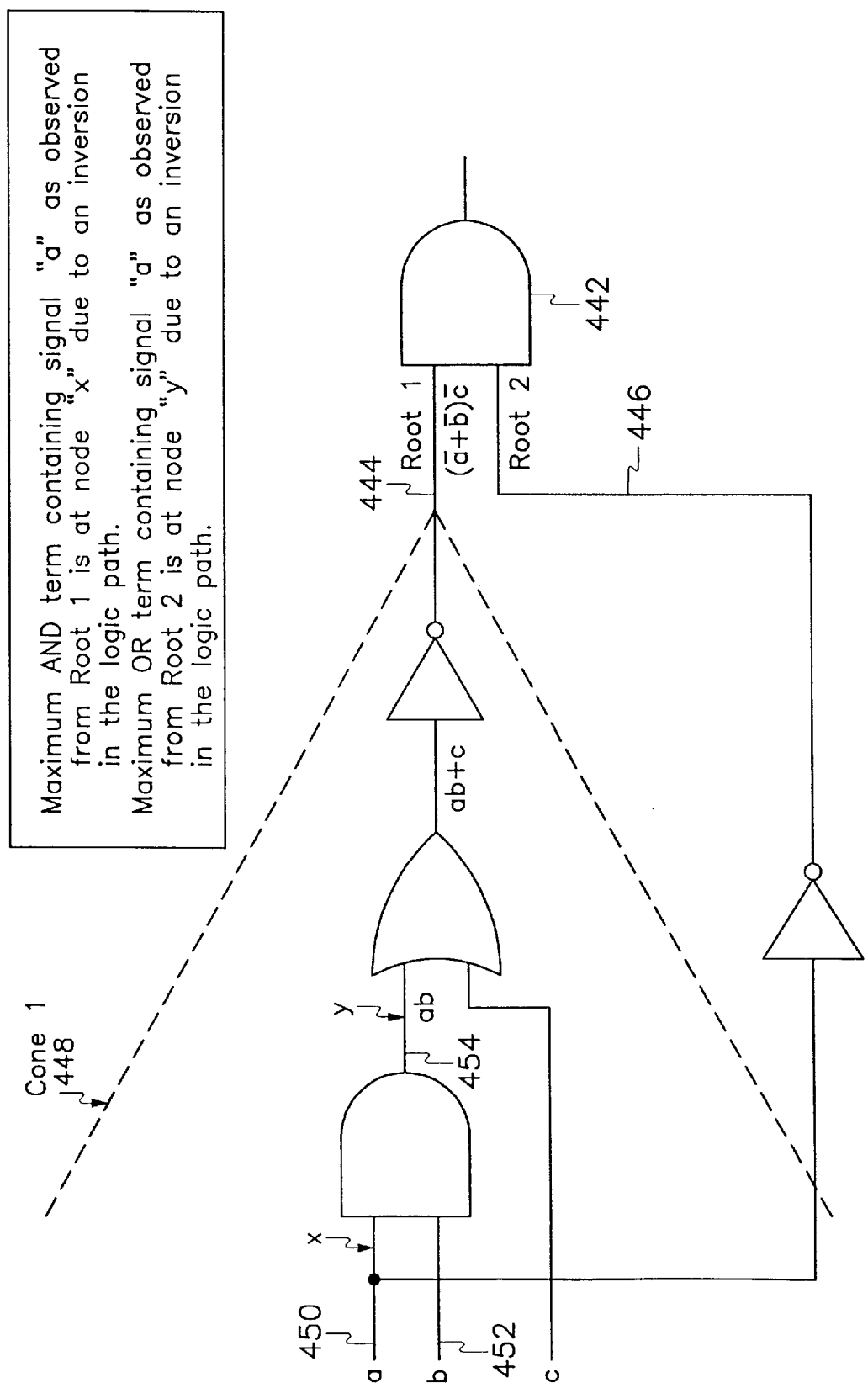

FIGS. 4(a) and 4(b) illustrate the concepts of a maximum AND term and a maximum OR term when the convergent logic block is either an SN or a PN.

In FIG. 4(a), SN convergent logic block 402 has root pins 404 and 406 defining a pair of cones. As shown by a phantom line, root pin 404 defines cone 408. Another cone (not labeled) is clearly defined by root pin 406. Moreover, signal "a" and signal "b", at respective nodes 410 and 412, are common leaves to both cones.

With respect to signal "a", the maximum AND term containing signal "a" as observed from root pin 404 is at node 414. Also, the maximum OR term is at node 410.

In FIG. 4(b), PN convergent logic block 442 has root pins 444 and 446 defining a pair of cones. As shown by a phantom line, root pin 444 defines cone 448. Another cone is defined by root pin 446. Moreover, signal "a" at node 450 is a common leaf to both cones.

With respect to signal "a", the maximum OR term containing signal "a", as observed from root pin 444, is at node 454. Also, the maximum AND term is at node 450.

The type of redundant term, i.e., either a maximum AND term or a maximum OR term, depends upon (1) the phase relationship of the convergence and (2) the type of convergent logic block, i.e., either SN or PN. The latter is known, but the former is determined as is shown in flowchart 300.

Thus, at flowchart block 308, it is determined whether the signal phase of the signal which originated at the common leaf in each of the two cones is either in-phase or out-of-phase at the root pins with respect to each other. More specifically, the number of inversions is counted along the logic path between the common leaf and the root pins. An even count in one cone as compared to an odd count in the other cone implies an out-of-phase relationship. Moreover, a consistent odd or even count in both cones implies an in-phase relationship.

Figure 5A:
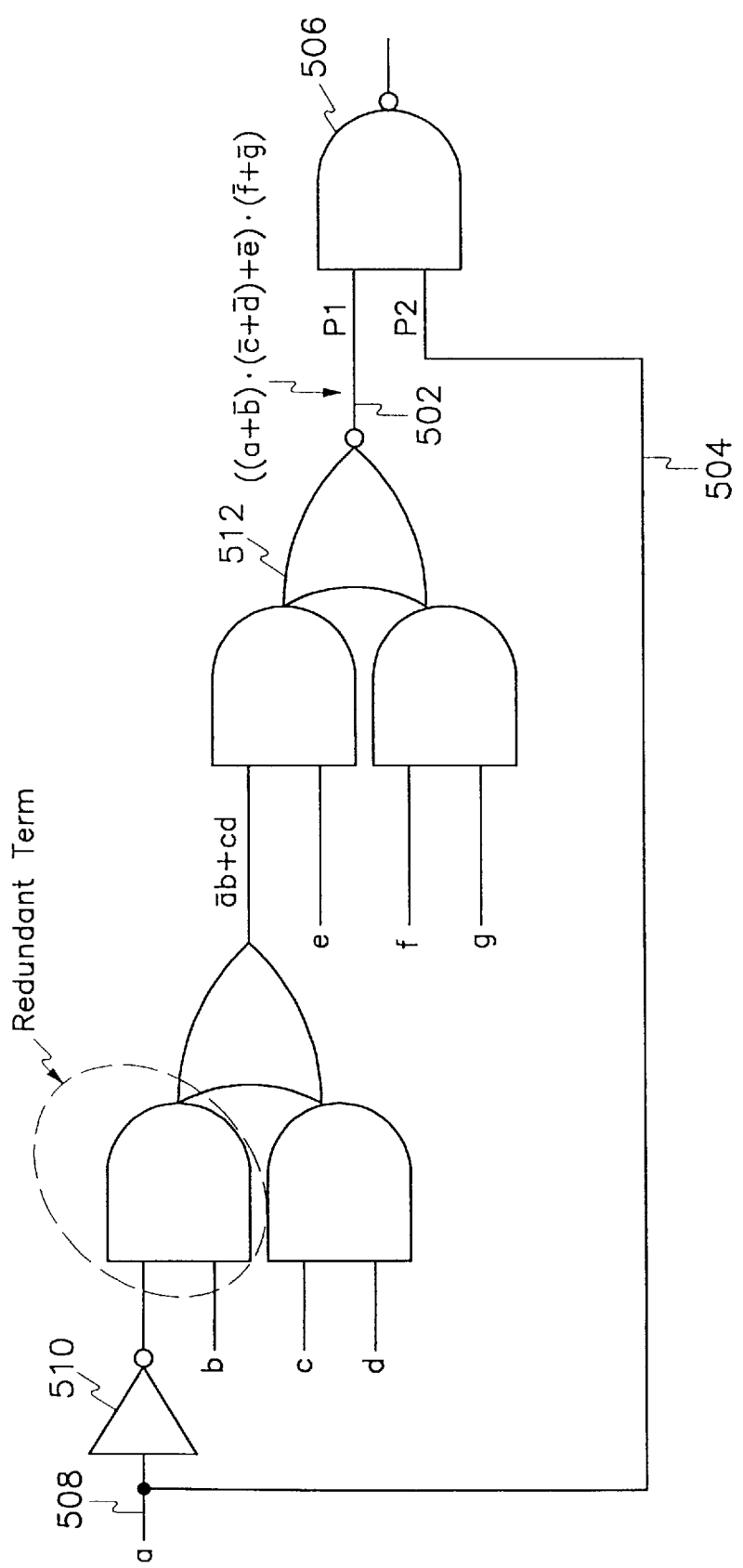
FIG. 5(a) and FIG. 5(b) demonstrate, respectively, an in-phase reconvergence and an out-of-phase reconvergence of a signal "a"
Figure 5B:
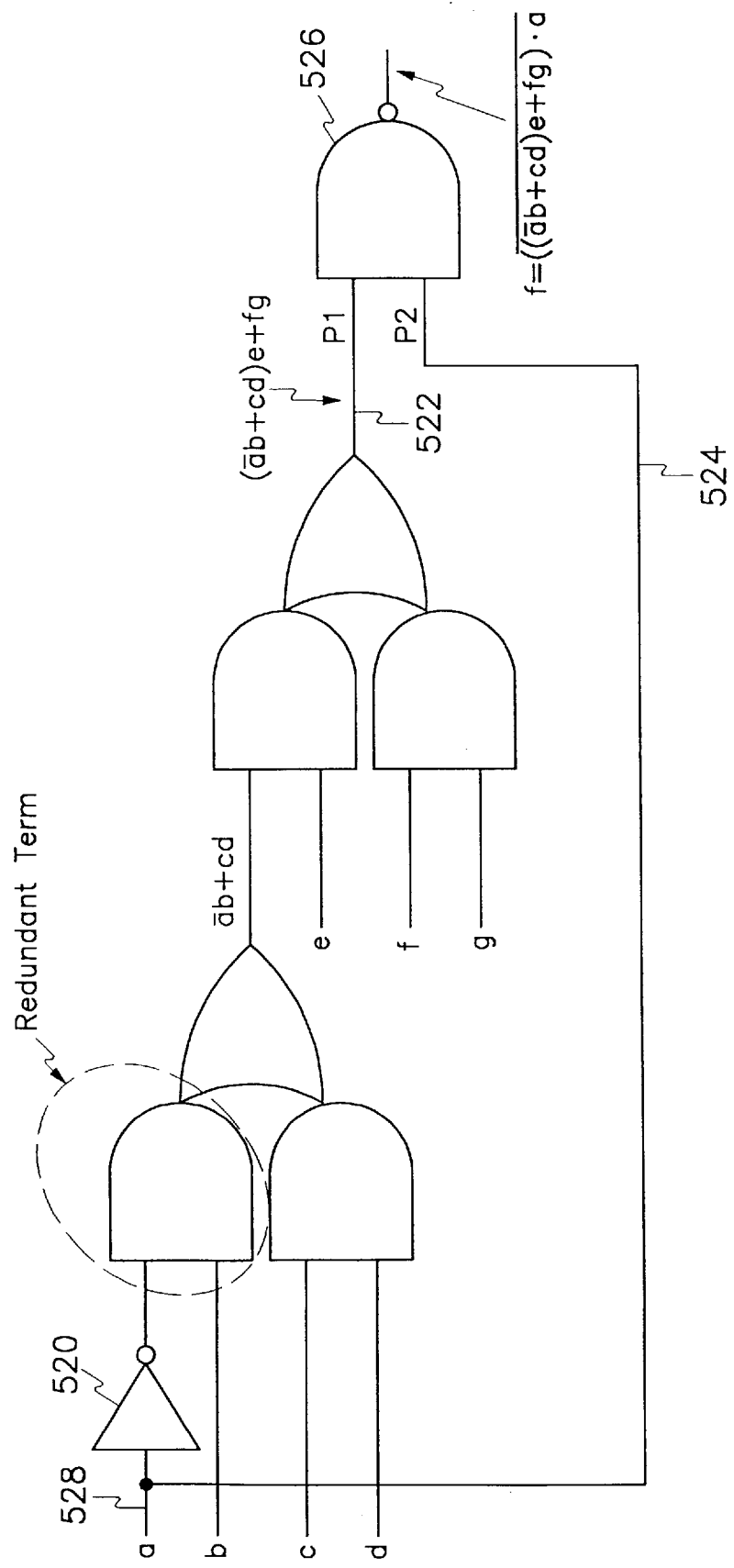

As an example, consider signal "a" of FIGS. 5(a) and 5(b). In FIG. 5(a), signal "a" is a common leaf of two cones having root pins 502 and 504 connected to convergent PN logic block 506.

FIG. 5(a) demonstrates an in-phase reconvergence of signal "a" between leaf node 508 and root pin 502. Said another way, the resultant signals due to signal "a" at nodes 502 and 504 are in-phase. As stated previously, whether the signals are in-phase is determined by counting inversions between the leaf node and the root pin. Accordingly, with respect to the cone defined by root pin 502, there is a total of two inversions present. Signal "a" is inverted once at invertor 510 and subsequently at NOR logic block 512, thereby resulting in noninverted signal "a" at root pin 502. Furthermore, with respect to the cone defined by root pin 504, no inversions are present. Hence, the phase of the resultant signals due to signal "a" at root pins 502 and 504 is the same, or they are "in-phase".

In FIG. 5(b), signal "a" is a common leaf of two cones having root pins 522 and 524 connected to convergent PN logic block 526.

FIG. 5(b) demonstrates an out-of-phase reconvergence of signal "a" between leaf node 528 and root pin 522. Said another way, the resultant signals due to signal "a" at nodes 522 and 524 are in-phase. With respect to the cone defined by root pin 522, signal "a" is inverted once at invertor 520, resulting in inverted resultant signal at root pin 522. Furthermore, with respect to the cone defined by root pin 524, no inversions are present. Hence, the phase of signal "a" at root pins 522 and 524 are not the same, or they are "out-of-phase".

To determine a redundant term in the case of an in-phase reconvergence of a signal at a PN, a "maximum OR term" containing the signal is identified. For example, consider the following Boolean logic term: ((a+b+c).d.e).(a.x) In the foregoing example, the term "((a+b+c).d.e)" is contributed by one cone, while "(a.x)" is contributed by the other cone. As indicated, signal "a" reconverges in-phase at an AND function. The maximum redundant term to be removed is (a+b+c), which is the maximum OR term containing signal "a".

Conversely, to determine a redundant term in the case of an out-of-phase reconvergence of a signal at a PN, a "maximum AND term" containing the signal is identified. For example, consider the following Boolean logic term: ((a.b.c+p.q.r+x.y.z).d.e).(-a.x). In the foregoing example, the term "((a.b.c+p.q.r+x.y.z).d.e)" is contributed by one cone, while "(-a.x)" is contributed by the other cone. As indicated, signal "a" reconverges out-of-phase at an AND function. The maximum redundant term to be removed is "a.b.c" which is the maximum AND term containing signal "a".

To determine a redundant term in the case of in-phase reconvergence of a signal at a SN, a "maximum AND term" containing the signal is identified. For example, consider the following Boolean logic term: ((a.b.c+p.q.r+x.y.z).d.e)+ (a.b) In the foregoing example, the term "((a.b.c+p.q.r+ x.y.z).d.e)" is contributed by one cone, while the term "(a.b)" is contributed by the other cone. As indicated, signal "a" reconverges in-phase at an OR logic block. The maximum redundant term to be removed is "a.b.c" which is the maximum AND term containing signal "a".

Conversely, to determine a redundant term in the case of an out-of-phase reconvergence of a signal at a SN, a "maximum OR term" containing signal must be identified. For example, consider the following Boolean logic term: ((a.b.c+p.q.r+x.y.z).d.e+(-a.x). In the foregoing example, the term "((a.b.c+p.q.r+x.y.z).d.e)" is contributed by one cone, while the term "(-a.x)" is contributed by the other cone. As shown, signal "a" reconverges out-of-phase at an AND function. The maximum redundant term to be removed is "a.b.c" which is the maximum AND term containing signal "a".

Accordingly, either (1) in the case of a PN with out-of-phase signals or (2) in the case of a SN with in-phase signals, flowchart 300 proceeds to flowchart block 310. In the former case at flowchart block 310, the maximum AND term containing the common leaf is determined. In the latter case at flowchart block 310, the maximum OR term containing the common leaf is determined.

Furthermore, either in the case of a PN with in-phase signals or in the case of a SN with out-of-phase signals, flowchart 300 proceeds to flowchart block 312. In the former case at flowchart block 310, the maximum OR term containing the common leaf is determined. In the latter case at flowchart block 312, the maximum AND term containing the common leaf is determined.

Next, at flowchart block 314, in the cone having the maximum redundant time, it is determined whether the logic path from the maximum redundant time to the respective convergent SN/PN logic block is free of any fanouts. This inquiry is made in order to insure that if logic is removed, it will only effect the convergent SN/PN logic block at issue.

As a design option, flowchart block 314 could be structured as a decision having the following functionality. If a fanout exists, then flowchart 300 returns to flowchart block 304, as shown by phantom arrow 315, in order to retrieve another common leaf, if any. Essentially, the foregoing action permits more compact logic which is logically redundant. Otherwise, flowchart 300 proceeds to flowchart block 316, where redundancy removal can occur. Redundancy removal is described in detail with respect to FIG. 6.

After redundancy removal has been performed, flowchart 300 is at an end. The method then returns to flowchart block 230 of flowchart 200.

Figure 6:
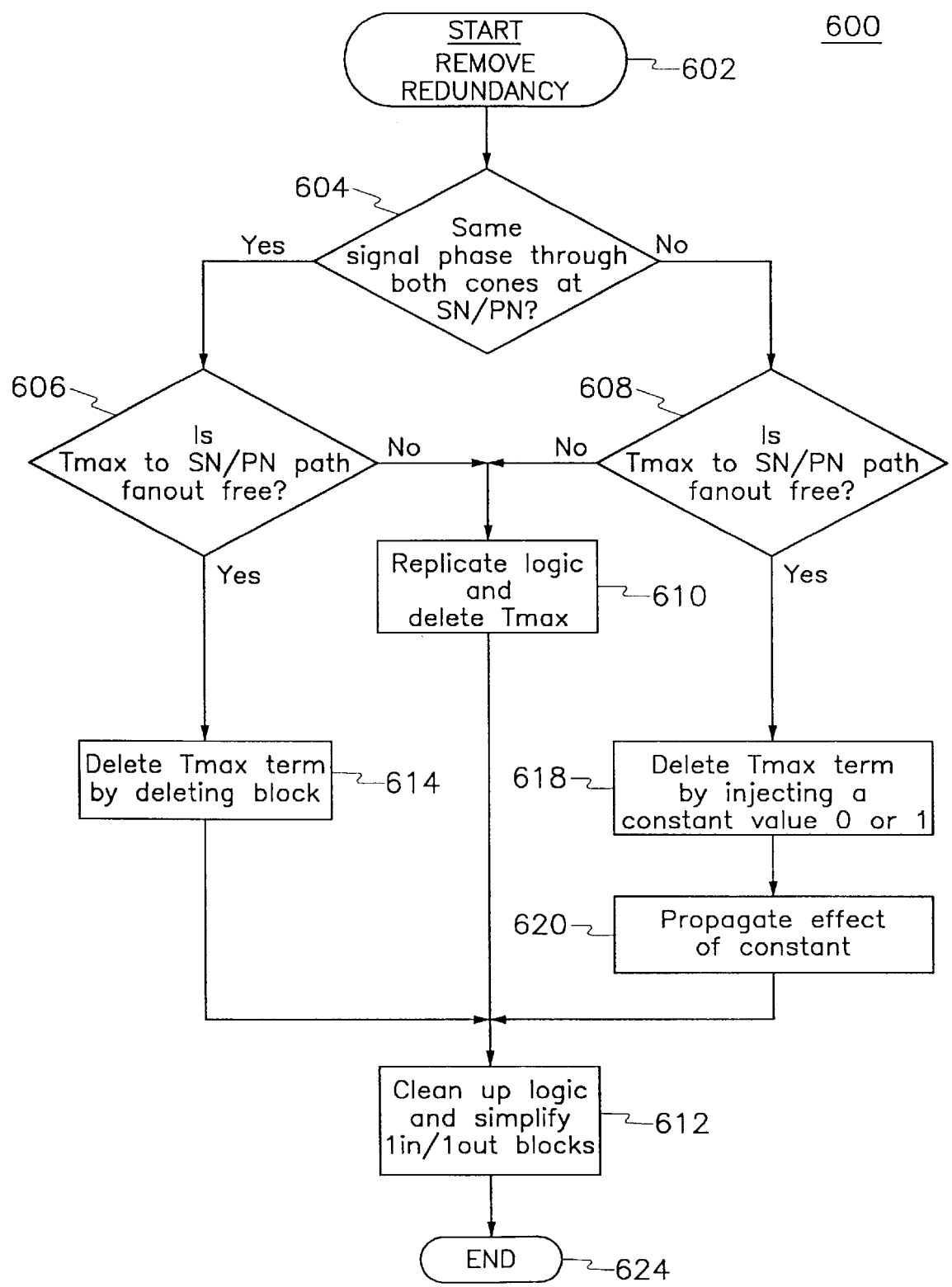
FIG. 6 shows the method for removing redundancies in accordance with the present invention wherein three techniques for removing redundancies is set forth.

FIG. 6 illustrates in detail the present invention in accordance with the preferred embodiment for removing maximum redundant terms ($T_{max}$). The manner in which a fault is removed depends upon the nature and location of the fault.

First, at flowchart block 604, it is considered whether the redundant term at issue has the same phase. If the phase is the same, then the flowchart 600 proceeds to flowchart block 606; otherwise, flowchart 600 proceeds to flowchart block 608.

At both flowchart blocks 606 and 608, it is determined whether the maximum redundant term is fanout free. If it is not, then the flowchart proceeds to flowchart block 610 from either flowchart block 606 or 608. At flowchart block 610, a first method for removing an redundant term is presented. The logic path from the output of the maximum redundant term to the respective root pin is replicated with the maximum redundant term deleted. Further, the logic is cleaned up at flowchart block 612. Among other things, cleaning up the logic entails simplifying logic blocks having a single input and output. Finally, flowchart 600 ends at flowchart end block 624.

As an example of the foregoing first method of removing an redundant term, consider FIG. 7(a) where a PN logic block is shown having root pins 702 and 704 as well as product convergent logic block 706. In FIG. 7, when considering signal "a" at leaf node 708, the maximum redundant term is signal "a" at node 708.

In accordance with the method of flowchart block 610 of FIG. 6, the logic path from the maximum redundant term, signal "a" at node 708, to root pin 702 is replicated with the maximum redundant term deleted. Accordingly, the logic path comprising leaf node 710 and NOR logic block 712 is replicated, while node 708 is deleted from the cone defined by root pin 702.

As a result, a logic configuration is derived as shown in FIG. 7(b). NOR logic block 712 of FIG. 7(a) has been replaced by invertor 714, because a NOR logic block with one input "b" is equivalent to an invertor with one input "b".

Referring back to flowchart block 606 of FIG. 6 (for in-phase signals), if the maximum redundant term is fanout free, then flowchart 600 proceeds to flowchart block 614, where a second method for removing a redundant term is presented. At flowchart block 614, the maximum redundant term is eliminated by deleting the logic block. Further, at next flowchart block 612, the logic is cleaned up, as discussed previously. Finally, the flowchart ends at flowchart end block 624.

Referring back to flowchart block 608 (for out-of-phase signal), if the maximum redundant term is fanout free, then flowchart 600 proceeds to flowchart block 618, where a third method for removing a redundant term is presented. The third method employs deleting the maximum redundant term by injecting a constant logic value, either a logic low (0) or a logic high (1). Next, at flowchart block 620, the effect of the constant is propagated so that the logic can be further simplified and cleaned up, as indicated by flowchart block 612. Finally, the flowchart ends at flowchart end block 624.

Figure 8A:
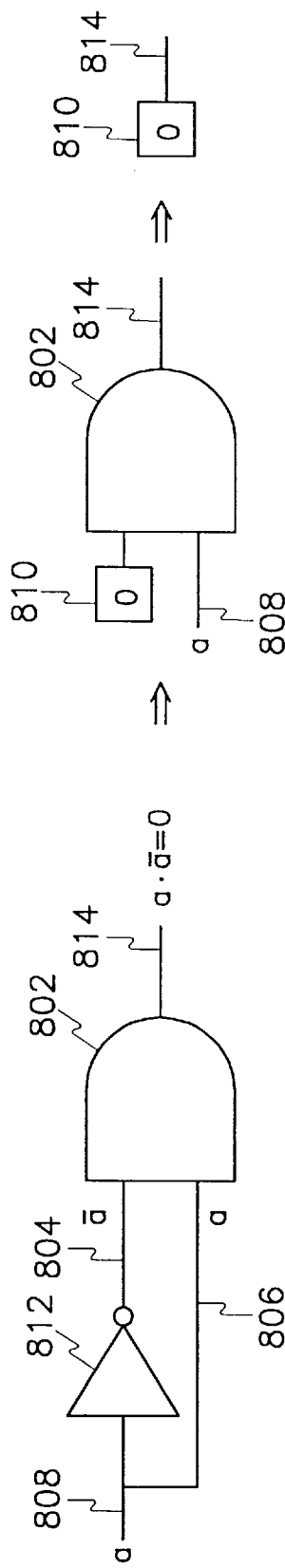
FIGS. 8(a) and 8(b) show yet another method of removing redundancies in accordance with the present invention wherein a constant logic source is implemented.
Figure 8B:
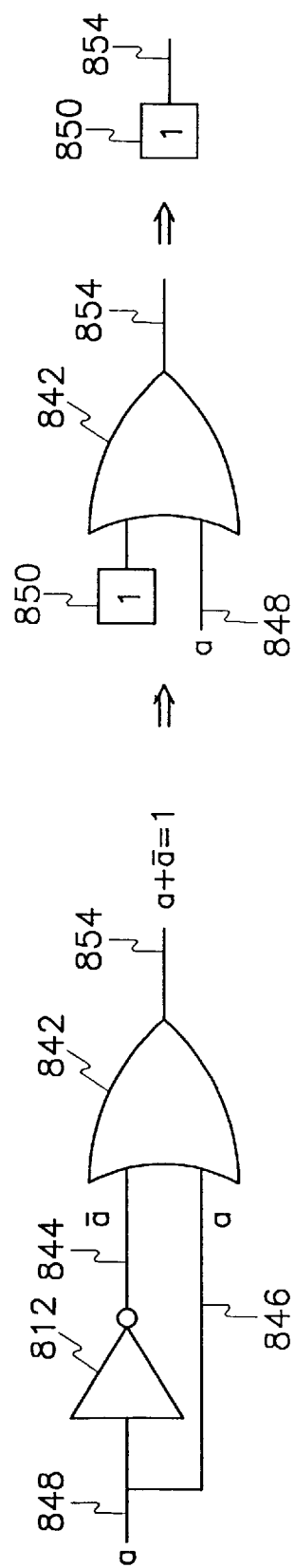

As an example of the third method for removing a redundant term, refer to FIGS. 8(a) and 8(b). FIG. 8(a) shows the method in regard to injecting a logic low, while FIG. 8(b) illustrates the method when injecting a logic high.

As shown in FIG. 8(a), a convergent Boolean product logic block 802 has root pins 804 and 806. Focusing on the cone defined by root pin 804, signal "a" at node 804 is deleted from the cone, in accordance with flowchart block 618. Next, a constant logic low 810 is propagated as shown. Moreover, the logic is simplified by eliminating needless AND logic block 802, invertor 812, and input signal "a", thereby resulting in the mere existence of low logic generator 810.

As shown in a similar FIG. 8(b), convergent Boolean sum logic block 842 has root pins 844 and 846. Focusing on the cone defined by root pin 844, signal "a" at node 844 is deleted from the cone, in accordance with flowchart block 618. Next, constant logic high 850 is propagated as shown. Moreover, the logic is simplified by eliminating needless OR logic block 852, invertor 852, and input signal "a", thereby resulting in the mere existence of high logic generator 850.

FIG. 8 illustrates what effect the propagation of constants have when the value "controls" the logic function it feeds. If the value has no controlling effect (e.g., a logic 1 into an AND with other inputs), then its connection is just dropped. In all these versions, the effect of the constant generally dissipates before reaching the root pin (but may not).

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

Having thus described our invention, what we claim as new and desire to secure by Letters Patent is:

1. A computer program product, comprising:
   a computer usable medium having computer readable program code means embodied in said medium for establishing a network configuration in accordance with a plurality of protocols of a network architecture, said computer readable program code means comprising:
   computer readable program code means for causing a computer to effect an identification of Boolean sum and product nodes in a data base model of the logic network;
   computer readable program code means for causing a computer to effect a determination of whether a redundancy exists for each reconvergent signal at each of said nodes; and
   computer readable program code means for causing a computer to effect an identification of a redundant term.

2. The computer program product of claim 1, further comprising computer readable program code means for causing a computer to effect removal of the redundant term from said model.

3. The computer program product of claim 1, further comprising computer readable program code means for causing a computer to effect a determination of whether the existence of said redundant term in said model would result in compact logic and a means for permitting said redundant term to remain in said model if compact logic would result.

4. The computer program product of claim 1, further comprising:
   computer readable program code means for causing a computer to effect an identification of two logic inputs to one of said nodes;
   computer readable program code means for causing a computer to effect a determination of whether said logic inputs have any common terms;
   computer readable program code means for causing a computer to effect a determination of the phase relationship of said common terms; and
   computer readable program code means for causing a computer to effect an identification of the maximum redundant term.

5. The computer program product of claim 1, further comprising a computer readable program code means for causing a computer to effect a replication of the logic between the redundant term and the respective node with the redundant term deleted.

6. The computer program product of claim 1, further comprising computer readable program code means for causing a computer to effect a replacement of the redundant term with a constant logic source.

7. The computer program product of claim 1, further comprising a computer readable program code means for causing a computer to effect a deletion of the logic block generating the redundant term.

8. A computer program product, comprising:
   a computer usable medium having computer readable program code means embodied in said medium that optimizes the ultimate implementation of a logic network by identifying redundancies in signal paths caused by reconverging signals, said computer readable program code means comprising:

first computer readable program code means for causing a computer to effect an identification of Boolean sum and product nodes in a database model of a logic network;

second computer readable program code means for causing a computer to effect a determination of whether a convergent signal exists for each of said Boolean sum and product nodes;

third computer readable program code means for causing a computer to effect an identification of a redundant term for each of said Boolean sum and product nodes having a convergent signal; and fourth computer readable program code means for causing a computer to effect a removal of said redundant term from said database model.

9. The computer program product of claim 8, wherein said third computer readable program code means causes a computer to effect an identification of either a maximum AND term or a maximum OR term.

10. The computer program product of claim 8, wherein said second computer readable program code means comprises:

computer readable program code means for causing a computer to effect an identification of two logic inputs to one of said Boolean sum and product nodes;

computer readable program code means for causing a computer to effect and identification of a leaf set for each of said two logic inputs; and computer readable program code means for causing a computer to effect a determination of whether said leaf sets for said two logic inputs have any common leaves, wherein a common leaf indicates a redundancy.

11. The computer program product of claim 10, wherein said third computer readable program code means comprises:

computer readable program code means for causing a computer to effect a propagation of a signal from said common leaf to root pins of said sum node or said product node;

computer readable program code means for causing a computer to effect a determination of the signal phase of said signal; and computer readable program code means for causing a computer to effect, if said signal phase is in-phase, a determination for said product node a maximum OR term that contains said common leaf and for said sum node a maximum AND term that contains said common leaf, and if the signal phase is out-of-phase, then determining for said product node a maximum AND term that contains said common leaf and for said sum node a maximum OR term that contains said common leaf.

12. The computer program product of claim 8, further comprising computer readable program code means for causing a computer to effect a determination of whether the existence of said redundant term in said model would result in compact logic and permitting said redundant term to remain in said model if said compact logic would result.

13. The computer program product of claim 8, further comprising computer readable program code means for causing a computer to effect a replication of the logic between said redundant term and the respective node with said redundant term deleted.

14. The computer program product of claim 8, further comprising computer readable program code means for causing a computer to effect a replacement of said redundant term with a constant logic source.

15. The computer program product of claim 8, further comprising computer readable program code means for causing a computer to effect a detection of the logic block generating the redundant term.

16. The computer program product of claim 8, wherein said logic network is an unmodified logic network.

* * * * *